(12) United States Patent
Hsieh et al.

(10) Patent No.: US 9,906,200 B2
(45) Date of Patent: Feb. 27, 2018

(54) POWER FILTER

(71) Applicant: DELTA ELECTRONICS, INC., Taoyuan (TW)

(72) Inventors: Shin-Chih Hsieh, Taoyuan (TW); Po-Jen Tsai, Taoyuan (TW); Chia-Chi Hsieh, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 156 days.

(21) Appl. No.: 14/929,874

(22) Filed: Nov. 2, 2015

(65) Prior Publication Data

US 2016/0276998 A1 Sep. 22, 2016

(30) Foreign Application Priority Data

Mar. 19, 2015 (CN) .......................... 2015 1 0121096

(51) Int. Cl.
*H03H 7/01* (2006.01)
*H05K 1/18* (2006.01)
(Continued)

(52) U.S. Cl.
CPC ........... *H03H 7/0115* (2013.01); *H01R 12/53* (2013.01); *H01R 12/58* (2013.01); *H03H 1/00* (2013.01); *H05K 1/182* (2013.01); *H05K 3/306* (2013.01); *H01F 27/306* (2013.01); *H01R 4/28* (2013.01); *H03H 2001/0035* (2013.01);
(Continued)

(58) Field of Classification Search
CPC ............. H03H 1/00; H03H 2001/0035; H03H 2001/0057; H03H 7/0115; H01R 12/53; H01R 12/58; H01R 4/28; H05K 1/82; H05K 3/306; H05K 2201/1003;
(Continued)

(56) References Cited

U.S. PATENT DOCUMENTS 4,757,282 A * 7/1988 Sakamoto ............ H03H 1/0007
                                                                                    333/181
2005/0036262 A1* 2/2005 Siebenthall .......... H03H 1/0007
                                                                                    361/118
(Continued)

FOREIGN PATENT DOCUMENTS

CN 201072848 Y 6/2008
DE 202013010951 U1 1/2014
(Continued)

*Primary Examiner* — Benny Lee
*Assistant Examiner* — Hafizur Rahman
(74) *Attorney, Agent, or Firm* — Muncy, Geissler, Olds & Lowe, P.C.

(57) ABSTRACT

A power filter is provided, including a circuit board module, an insulating base, several connect terminals, and an inductor. The circuit board module includes a circuit board and several electronic components, wherein the circuit board forms several connect holes thereon and the electronic components are electrically connected to the circuit board. The connect terminals are fixed on the insulating base and each has a connecting part and a clamping part, wherein the connecting parts are joined with the connect holes of the circuit board. The inductor includes at least one wire with both terminals clamped by the clamping parts, and the wire is electrically connected to the circuit board module through the connecting parts.

9 Claims, 4 Drawing Sheets

(51) Int. Cl.
*H05K 3/30* (2006.01)
*H01R 12/53* (2011.01)
*H01R 12/58* (2011.01)
*H03H 1/00* (2006.01)
*H01F 27/30* (2006.01)
*H01R 4/28* (2006.01)

(52) U.S. Cl.
CPC ........... *H03H 2001/0057* (2013.01); *H05K 2201/1003* (2013.01); *H05K 2201/10303* (2013.01); *H05K 2201/10962* (2013.01)

(58) Field of Classification Search
CPC .......... H05K 2201/10303; H05K 2201/10962; H01F 27/306
USPC .............. 333/181, 185; 363/39, 45, 47; 439/620.1, 622.13
See application file for complete search history.

(56) References Cited

U.S. PATENT DOCUMENTS

| | | |
|---|---|---|
| 2014/0062617 A1 | 3/2014 | Heo et al. |
| 2014/0191598 A1 | 7/2014 | Winheim et al. |

FOREIGN PATENT DOCUMENTS

| | | |
|---|---|---|
| JP | 4-34012 U | 3/1992 |
| JP | 5-63114 U | 8/1993 |
| JP | 6-52227 U | 7/1994 |
| JP | 5-87932 U | 1/2014 |

* cited by examiner

POWER FILTER

CROSS REFERENCE TO RELATED APPLICATIONS

The present application claims priority of China Patent Application No. 201510121096.1, filed on Mar. 19, 2015, the entirety of which is incorporated by reference herein.

BACKGROUND OF THE INVENTION

Field of the Invention

The present application relates to an electronic filter, and in particular to a power filter.

Description of the Related Art

A power filter is an electronic filter that is placed between an external power source and electronic devices, for reducing electromagnetic interference (EMI) on the power line between the electronic devices and the power source. Commonly, a power filter may include several electronic components such as capacitors and inductors.

However, the winding and welding processes of terminals of the electronic components in the power filter are mostly performed by manual methods in the prior art. Thus, there is a need for a lot of operating time and labor costs, and also limits on the production capacity.

BRIEF SUMMARY OF THE INVENTION

In view of the aforementioned problems, an embodiment of the invention provides a power filter including a circuit board module, an insulating base, several connect terminals, and an inductor. The circuit board module includes a circuit board and several electronic components, wherein the circuit board forms several connect holes thereon and the electronic components are electrically connected to the circuit board. The connect terminals are fixed on the insulating base and each has a first connecting part and a clamping part, wherein the first connecting parts are joined with the connect holes of the circuit board. The inductor includes at least one wire with both terminals clamped by the clamping parts, and the wire is electrically connected to the circuit board module through the first connecting parts.

In some embodiments, the electronic components are capacitors and/or resistors.

In some embodiments, the first connecting part and the clamping part of each connect terminal form an angle therebetween, wherein the angle is any angle between 90 degrees and 360 degrees, except for 360 degrees.

In some embodiments, the power filter also includes a ground terminal fixed on the insulating base, and the ground terminal is not connected to the wire of the inductor.

In some embodiments, the ground terminal has a second connecting part that is joined with one of the connect holes of the circuit board.

In some embodiments, the power filter also includes a housing that is combined with the insulating base for accommodating the circuit board module and the inductor therein.

In some embodiments, the housing comprises plastic or metal material.

In some embodiments, the electronic components are electrically connected to the circuit board by plug-in or welding processes.

Another embodiment of the invention provides a power filter including a circuit board module, an insulating base, several connect terminals, and an inductor. The circuit board module includes a circuit board and several electronic components, wherein the electronic components are electrically connected to the circuit board. The connect terminals are fixed on the insulating base and each has a first connecting part and a clamping part, wherein the first connecting parts are electrically connected to the circuit board. The inductor includes at least one wire with both terminals clamped by the clamping parts, and the wire is electrically connected to the circuit board module through the first connecting parts.

In the invention, the electronic components are placed onto the circuit board to form a circuit board module, and then the circuit board module can be directly electrically connected to the connect terminals to form a circuit loop. Finally, the inductor is directly joined with and electrically connected to the connect terminals (through the terminals of the inductor being fixed by the clamping parts of the connect terminals) to accomplish the power filter. Consequently, the complex manual work can be eliminated and the operating time and labor costs can also be effectively reduced.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
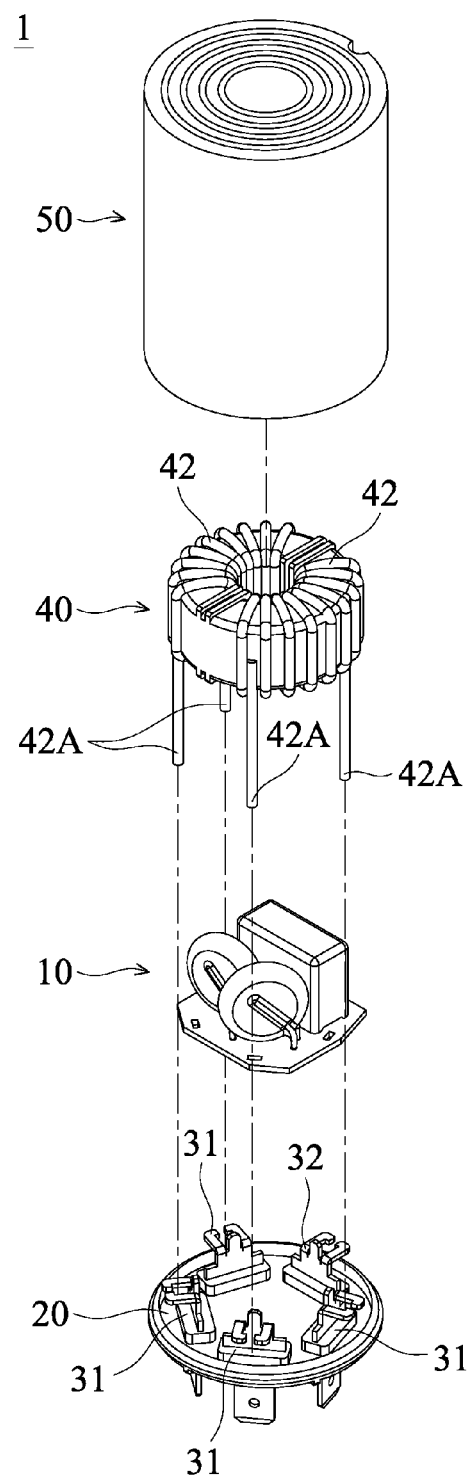
FIG. 1 is an exploded view of a power filter according to an embodiment of the invention.

In order to illustrate the purposes, features, and advantages of the invention, the preferred embodiments and figures of the invention are shown in detail as follows.

In the following detailed description, the orientations of "on", "over", "under", and "below" are used for representing the relationship between the relative positions of each element as illustrated in the drawings, and are not meant to limit the invention.

FIG. 1 is an exploded view of a power filter 1 according to an embodiment of the invention. As shown in FIG. 1, the power filter 1 includes a circuit board module 10, a base 20, several connect terminals 31, a ground terminal 32, an inductor 40, and a housing 50.

Figure 2:
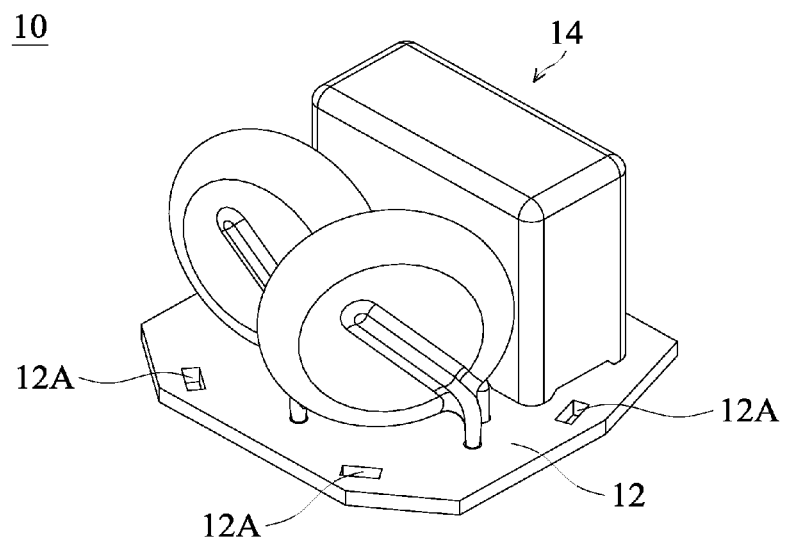
FIG. 2 is an enlarged view of the circuit board module in FIG. 1.

FIG. 2 is an enlarged view of the circuit board module 10 in FIG. 1. As shown in FIG. 2, the circuit board module 10 includes a circuit board 12 and several electronic components 14. In some embodiments, the circuit board 12 may be a printed wire board (PWB) or a printed circuit board (PCB). In some embodiments, the electronic components 14 may be capacitors (e.g. inter-phase capacitors) and/or resistors (e.g. ground resistors). Furthermore, the types, specifications and numbers of the capacitors and resistors can be selected based on demand and are not limited.

As shown in FIG. 2, the circuit board 12 of this embodiment forms several connect holes 12A, for example five connect holes 12A (FIG. 2 only depicts three connect holes 12A due to the limitations of the viewing angle) thereon. The electronic components 14 can be electrically connected to the circuit board 12 by plug-in or welding processes, and are electrically connected to the connect holes 12A.

Figure 3:
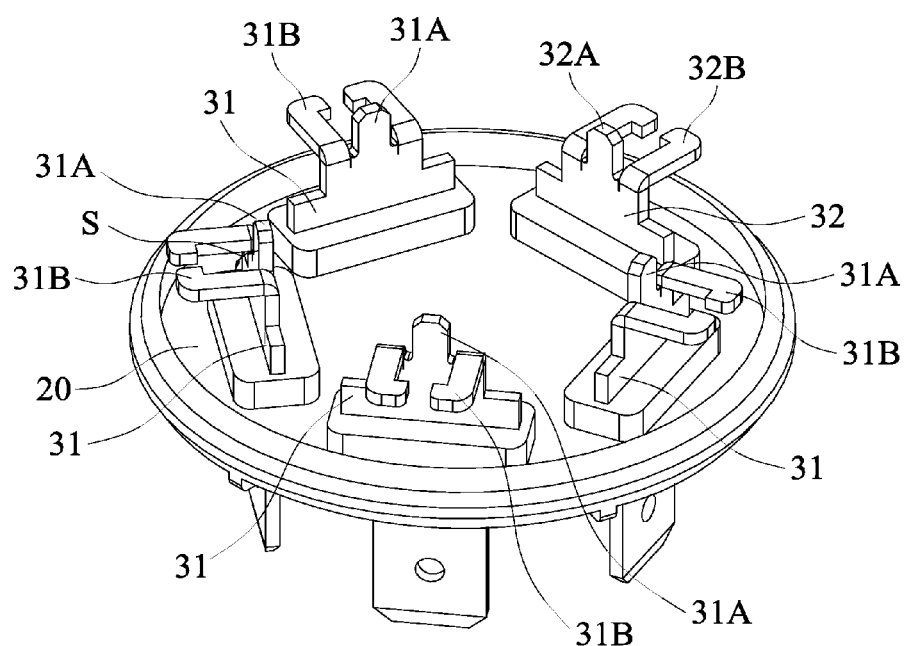
FIG. 3 is an enlarged view of the insulating base and the terminals thereon in FIG. 1.

FIG. 3 is an enlarged view of the base 20 and the terminals 31, 32 thereon in FIG. 1. In this embodiment, the base 20 is a disc-shaped insulating base and can be made of plastic material. As shown in FIG. 3, the base 20 has several connect terminal 31, for example four connect terminals 31, and a ground terminal 32 mounted thereon. It should be appreciated that the connect terminals 31 and the ground terminal 32 may be conductive terminals having the same structure, made of metal material.

As shown in FIG. 3, the connect terminals 31 and the ground terminal 32 are fixed on the base 20 and protrude from the upper and lower surfaces thereof. Moreover, the connect terminals 31 each has a connecting part 31A (first connecting part) and a clamping part 31B (first clamping part) that are integrally formed in one piece. For each of the connect terminals 31, the connecting part 31A and the clamping part 31B are extended outwardly from the main body of the connect terminal 31. Also, the connecting part 31A and the clamping part 31B form an angle S therebetween, wherein the angle S may be any angle greater than 0 degrees and less than 360 degrees. Preferably, the angle S is any angle between 90 degrees and 360 degrees, except for 360 degrees. More preferably, the angle S is about 90 degrees (as shown in FIG. 3).

Similarly, as shown in FIG. 3, the ground terminal 32 has a connecting part 32A (second connecting part) and a clamping part 32B (second clamping part) that are integrally formed in one piece. Specifically, the connecting part 32A and the clamping part 32B are extended outwardly from the main body of the ground terminal 32. Also, the connecting part 32A and the clamping part 32B form an angle therebetween, wherein the angle may be any angle greater than 0 degrees and less than 360 degrees. Preferably, the angle is any angle between 90 degrees and 360 degrees, except for 360 degrees. More preferably, the angle is about 90 degrees.

It should be noted that the total number of the connect terminals 31 and the ground terminal 32 is corresponding to the number of the connect holes 12A on the circuit board 12.

Figure 4:
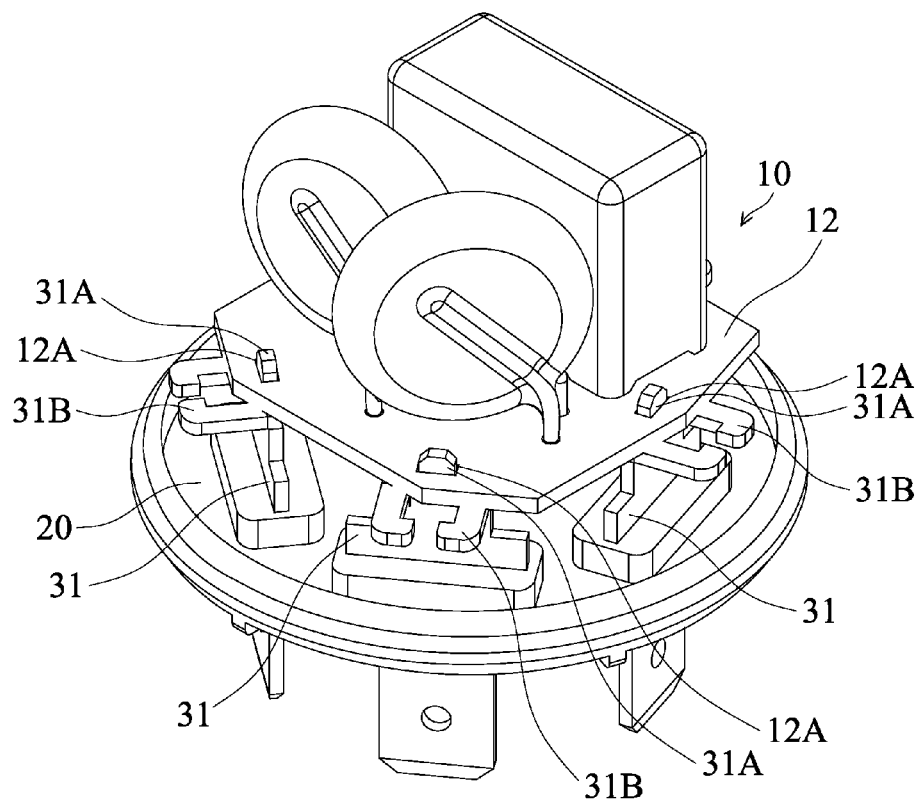
FIG. 4 is a schematic view of the circuit board module and the terminals in FIG. 1 after assembly.

FIG. 4 is a schematic view of the circuit board module 10 and the terminals 31, 32 in FIG. 1 after assembly (FIG. 4 only depicts the state of the circuit board module 10 and three connect terminals 31 after assembly due to the limitations of the viewing angle). As shown in FIG. 4, the circuit board module 10 can be electrically connected to the connect terminals 31 and the ground terminal 32 by joining the connect holes 12A on the circuit board 12 and the connecting parts 31A, 32A of the connect terminals 31 and the ground terminal 32, thereby positioning the circuit board module 10 simultaneously. Also, in order to prevent the connect holes 12A from separating from the connecting parts 31A and 32A, the connect holes 12A and the connecting parts 31A, 32A may be welded together, to increase the overall reliability of the power filter 1 (FIG. 1). In some embodiments, the connect holes 12A on the circuit board 12 may also be omitted, and the circuit board 12 and the connecting parts 31A, 32A are directly electrically connected by welding processes.

Figure 5:
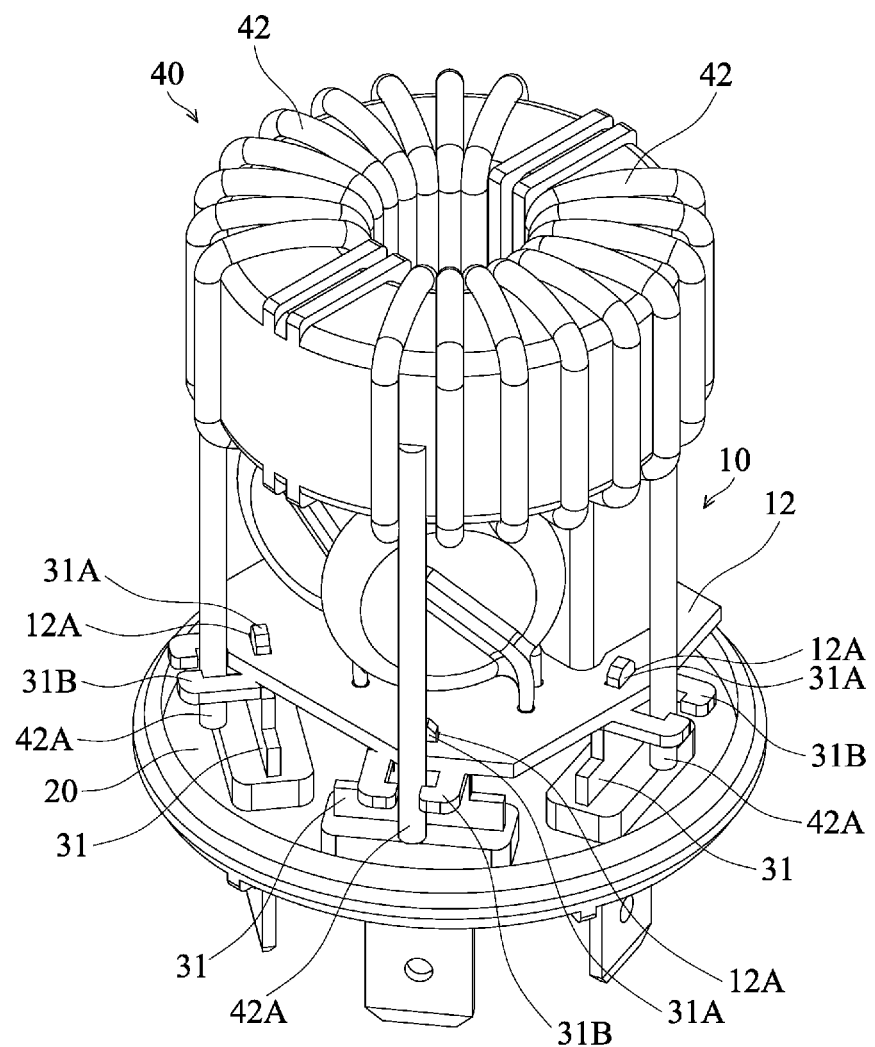
FIG. 5 is a schematic view of the inductor, the circuit board module, and the terminals in FIG. 1 after assembly.

FIG. 5 is a schematic view of the inductor 40, the circuit board module 10, and the terminals 31, 32 in FIG. 1 after assembly. Referring to FIG. 1 and FIG. 5, the inductor 40 includes a ring-shaped magnetic core and two wires 42 wound around the magnetic core. Specifically, when the terminals 42A (a total of four terminal 42A) of the two wires 42A are clamped by the clamping parts 31B of the connect terminals 31, the inductor 40 can be appropriately positioned above the circuit board module 10 and the insulating base 20 and directly electrically connected to the circuit board module 10 through the connecting parts 31A of the connect terminals 31. Moreover, the wires 42 of the inductor 40 are not connected to the ground terminal 32. Therefore, the power filter 1 of this embodiment can provide two single-phase filter circuits and a common ground terminal.

Referring to FIG. 1, after accomplishing the aforementioned assembly of the circuit board module 10, the base 20, the terminals 31, 32, and the inductor 40, the housing 50 can be combined with the base 20 for accommodating the circuit board module 10 and the inductor 40 therein. In this embodiment, the housing 50 has a hollow and substantially cylindrical structure, and comprises plastic or metal material. Thus, the housing 50 and the base 20 can protect the various electronic components in the power filter 1 and isolate external electromagnetic waves.

It should be noted that, if the housing 50 is made of a metal material, it is likely to contact the electronic components in the power filter 1 to form a short circuit. Accordingly, there may be an insulating material layer inside the housing 50 or an insulating material filled in the chamber between the housing 50 and the base 20, so as to reduce the risk of short circuiting.

Furthermore, the invention is not limited to the aforementioned embodiments.

In some embodiments of the invention, the ground terminal 32 may also have a different structure from the connect terminals 31. For example, the ground terminal 32 may have only a (second) connecting part 32A without the clamping part 32B, and can be electrically connected to the circuit board module 10 through the connecting part 32A being joined with one of the connect holes 12A of the circuit board 12.

In some embodiments of the invention, the ground terminal 32 may also be omitted. In other words, the power filter 1 can provide only two single-phase filter circuits without a common ground terminal.

In some embodiments of the invention, the housing 50 may also be omitted, and the various electronic components on the base 20 can be covered by an insulating material (e.g. epoxy resin) directly.

In some embodiments of the invention, the inductor 40 may also include only a single wire 42, and the insulating base 20 may have only two connect terminals 31 and a ground terminal 32 thereon. Specifically, when both terminals 42A of the wire 42 are clamped by the clamping parts 31B of the connect terminals 31, the inductor 40 can be appropriately positioned above the circuit board module 10 and the insulating base 20 and directly electrically connected to the circuit board module 10 through the connecting parts 31A of the connect terminals 31. Therefore, the power filter 1 can provides a single-phase filter circuit and a common ground terminal. In some embodiments of the invention, the ground terminal 32 (i.e. the common ground terminal) may also be omitted.

As described above, the invention provides a power filter which primarily includes a circuit board module, an insulating base, several connect terminals, and an inductor. The circuit board module includes a circuit board and several electronic components (such as capacitors and/or resistors), wherein the circuit board forms several connect holes thereon and the electronic components are electrically connected to the circuit board. The connect terminals are fixed on the insulating base and each has a connecting part and a clamping part, wherein the connecting parts are joined with the connect holes of the circuit board. The inductor includes at least one wire with both terminals clamped by the clamping parts of the connect terminals, and the wire is electrically connected to the circuit board module through the connecting parts of the connect terminals.

A feature of the aforementioned embodiments is to add a circuit board module, so as to simplify the assembly processes of the power filter. Specifically, the circuit board of the circuit board module is designed such that the electronic components such as capacitors and/or resistors can only be placed in the specific and predetermined positions. In this way, the assembly dislocation can be prevented compared to the conventional method which needs manual labor to twist terminals of the electronic components and the accurate terminals together. Also, the risk that terminals of the electronic components might be damaged due to the pull stress during the winding process can be reduced, thereby improving the production quality.

Furthermore, the electronic components such as capacitors and/or resistors are placed onto the circuit board to form a circuit board module, and then the circuit board module can be directly electrically connected to the connect terminals (via the connect holes on the circuit board and the connecting parts of the connect terminals) to form a circuit loop. Finally, the inductor is directly joined with and electrically connected to the connect terminals (through the terminals of the inductor being fixed by the clamping parts of the connect terminals) to accomplish the power filter. Consequently, the complex manual work can be eliminated and the operating time and labor costs can also be effectively reduced, thereby improving the production capacity.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power filter, comprising:
   a circuit board module, including a circuit board and a plurality of electronic components,
   wherein the circuit board forms a plurality of connect holes thereon and the electronic components are electrically connected to the circuit board;
   an insulating base;
   a plurality of connect terminals, fixed on the insulating base, and each having a first connecting part and a clamping part, wherein the first connecting part and the clamping part are integrally formed in one piece, and the first connecting parts are joined with the connect holes of the circuit board; and
   an inductor, including at least one wire, wherein the at least one wire includes at least two terminals, and the terminals of the wire are both physically clamped by a respective one of the clamping parts and the wire is electrically connected to the circuit board module through a corresponding one of the first connecting parts.

2. The power filter as claimed in claim 1, wherein the electronic components are capacitors and/or resistors.

3. The power filter as claimed in claim 1, wherein the first connecting part and the clamping part of each connect terminal form an angle there between, and the angle is set to 90 degrees.

4. The power filter as claimed in claim 1, further comprising a ground terminal fixed on the insulating base, and the ground terminal is not connected to the wire of the inductor.

5. The power filter as claimed in claim 4, wherein the ground terminal has a second connecting part that is joined with one of the connect holes of the circuit board.

6. The power filter as claimed in claim 1, further comprising a housing that is combined with the insulating base for accommodating the circuit board module and the inductor therein.

7. The power filter as claimed in claim 6, wherein the housing comprises plastic or metal material.

8. The power filter as claimed in claim 1, wherein the electronic components are electrically connected to the circuit board by plug-in or welding processes.

9. A power filter, comprising:
   a circuit board module, including a circuit board and a plurality of electronic components,
   wherein the electronic components are electrically connected to the circuit board;
   an insulating base;
   a plurality of connect terminals, fixed on the insulating base and each having a first connecting part and a clamping part, wherein the first connecting part and the clamping part are integrally formed in one piece, and the first connecting parts are electrically connected to the circuit board; and
   an inductor, including at least one wire, wherein the at least one wire includes at least two terminals, and the terminals of the wire are both physically clamped by a respective one of the clamping parts and the wire is electrically connected to the circuit board module through a corresponding one of the first connecting parts.

* * * * *